United States Patent [19]

Shirai et al.

[11] 3,939,353

[45] Feb. 17, 1976

[54] ELECTRON MICROSCOPE SPECIMEN MOUNTING APPARATUS

[75] Inventors: Shogo Shirai, Yokohama; Haruo Uchida, Machida, both of Japan

[73] Assignee: Kabushiki Kaisha Akashi Seisakusho, Japan

[22] Filed: Apr. 9, 1975

[21] Appl. No.: 566,347

Related U.S. Application Data

[63] Continuation of Ser. No. 501,802, Aug. 29, 1974, abandoned, which is a continuation of Ser. No. 361,181, May 17, 1973, abandoned.

[30] Foreign Application Priority Data

May 22, 1972 Japan............................ 47-50588

[52] U.S. Cl. ............... 250/441; 250/442; 250/311
[51] Int. Cl.² ........................................ G21K 5/06
[58] Field of Search ........... 250/442, 440, 441, 398, 250/311

[56] References Cited
UNITED STATES PATENTS

| | | | |
|---|---|---|---|
| 2,268,539 | 12/1941 | Berries et al......................... | 250/398 |
| 2,356,551 | 8/1944 | Berries et al......................... | 250/442 |
| 2,939,955 | 6/1960 | Rommerts............................ | 250/398 |
| 3,308,294 | 3/1967 | Ozasa.................................. | 250/398 |
| 3,405,264 | 10/1968 | Fairbanks et al. .................. | 250/442 |

*Primary Examiner*—Archie R. Borchelt
*Assistant Examiner*—B. C. Anderson
*Attorney, Agent, or Firm*—Robert E. Burns; Emmanuel J. Lobato; Bruce L. Adams

[57] ABSTRACT

An apparatus for releasably and adjustably mounting a specimen in an electron microscope. A specimen-holding unit is releasably and fluidtightly mounted in an evacuatable chamber and abutting the lens of the electron microscope in the mounted position. The unit is held in place by the pressure differential between the chamber and the atmosphere when the chamber is evacuated. The specimen-holding unit comprises a rotatable specimen-holding shaft disposed eccentrically within a rotatable support member. The specimen is variably positioned under the electron beam by the rotation of the member and the rotation of the shaft with respect to the member.

7 Claims, 2 Drawing Figures

ELECTRON MICROSCOPE SPECIMEN MOUNTING APPARATUS

This is a continuation of application Ser. No. 501,802, filed Aug. 29, 1974, now abandoned, which was a Continuation of Ser. No. 361,181, filed May 17, 1973 now abandoned.

BACKGROUND OF THE INVENTION

The present invention relates to an apparatus for mounting a specimen in an electron microscope.

Generally, with known specimen mounting apparatus of this type, a specimen chamber is evacuated while the electron microscope is in use, and is returned to atmospheric pressure when the specimen is changed. This necessitates that the position of the specimen be adjusted from outside the chamber. This has resulted in apparatus that is complicated in construction, troublesome to handle, and sensitive to vibrations which cause a focusing problem.

In addition conventional specimen mounting apparatus need complicated structure to indicate the position of the electron beam of an electron microscope on a specimen during use of the electron microscope.

SUMMARY OF THE INVENTION

The object of the present invention is to solve the aforementioned problems in conventional specimen mounting apparatus by providing a specimen mounting apparatus capable of simple construction and ease of handling.

Another object of the present invention is to provide a specimen mounting apparatus which is releasably coupled to the electron lens of an electron microscope to prevent the relative movement of one with respect to the other to ensure proper focusing when the specimen mounting apparatus is induced to vibrate.

A further object of the present invention is to provide a specimen mounting apparatus which can easily adjustably position a specimen to be irradiated by an electron beam to select a portion of the specimen to be irradiated.

A still further object of the present invention is to provide a specimen mounting apparatus which is capable of indicating the relative position of the specimen to be irradiated to thereby indicate the portion of the specimen that has been selected to be irradiated.

Still another object of the present invention is to provide a specimen mounting apparatus which can be easily inserted and removed to change the specimen.

These and the other objects of the present invention are carried out by the specimen mounting apparatus of the present invention which comprises specimen-holding means positionable into an irradiating position wherein a portion of the specimen is exposed to the electron beam. The specimen-holding means includes means for adjustably positioning the specimen, when the specimen-holding means is in the irradiating position, to variably select the portion of the specimen exposed to the electron beam. The apparatus also includes means for releasably mounting the specimen-holding means in the irradiating position and for releasably coupling the specimen-holding means to the electron lens, when the specimen-holding means is in the irradiating position, to transmit vibratory motion from the specimen-holding means to the lens to substantially prevent the relative movement of one with respect to the other whenever the specimen-holding means is induced to vibrate, thus maintaining the focus of the electron beam on the selected portion of the specimen.

The specimen-holding means comprises a rotatable, elongated, cylindrical member having means disposed at one end portion thereof for mounting the specimen. The elongated member is fluidtightly mounted for rotation about its longitudional axis in a rotatable cylindrical support member which has a main axis about which it is mounted to rotate. The elongated member is inserted in the support member in a throughbore that has an axis parallel to the main axis of the support member and disposed eccentrically thereof.

The means for coupling the specimen-holding means to the electron lens comprises means for forcibly abutting a portion of the specimen-holding means on the electron lens. In addition, an intermediate member which contacts the electron lens may be provided and in this case means are provided for forcibly abutting a portion of the specimen-holding means on the intermediate member. The means for releasably mounting the specimen-holding means comprises an evacuatable specimen chamber that is receptive of a negative pressure applied thereto and has means therein defining a throughbore for fluidtightly receiving the specimen-holding means. Thus the specimen-holding means is forcibly held in the wall of the specimen chamber when a pressure differential is developed between the chamber and the atmosphere by evacuating the specimen chamber.

The apparatus further comprises indicating means for indicating the relative position of the specimen thereby indicating the portion of the specimen exposed to the electron beam. The indicating means comprises a pilot member with a pilot area approximately as large as the means for mounting the specimen that is disposed at the one end portion of the elongated member. The pilot member is attached to the other end portion of the elongated member. An indicating member is provided with an indicating part that moves in correspondence with the portion of the specimen relative to the electron beam. The indicating part is located close to the surface of the pilot area.

Having in mind the above and other objects that will be obvious from an understanding of the disclosure, the present invention comprises the combinations and arrangements of parts illustrated in the presently preferred embodiments of the present invention which is here and after set forth in sufficient detail to enable those persons skilled in the art to clearly understand the function, operation, construction, and advantages of it when read in conjunction with the accompanying drawings.

DESCRIPTION OF THE PREFERRED EMBODIMENTS

Figure 1:
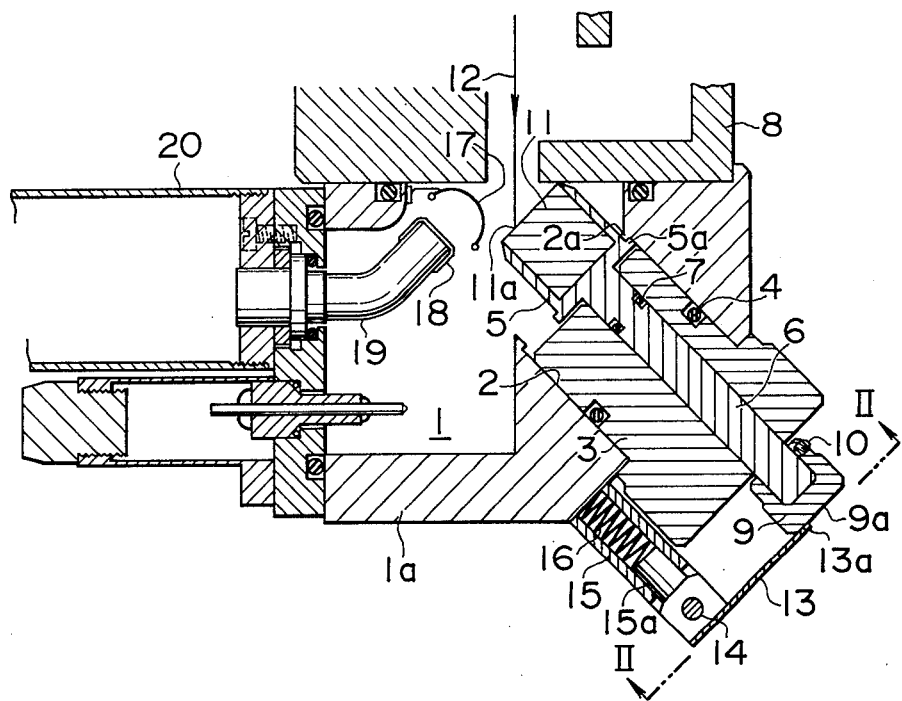
FIG. 1 is a sectional view of a specimen mounting apparatus, according to the present invention for a scanning type electron microscope.
Figure 2:
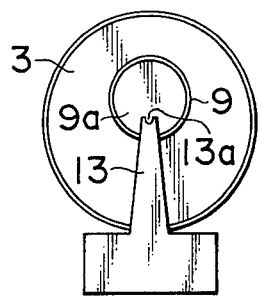
FIG. 2 is a view of the apparatus of FIG. 1 along the line II—II of FIG. 1.

The embodiments of the present invention, will be described by reference to the accompanying drawings. FIG. 1 is a side sectional view of the specimen mounting apparatus for a scanning type electron microscope, and FIG. 2 is a view looking in the direction of the line II—II of FIG. 1. As shown in these drawings, a rotatable cylindrical support member comprising an external shaft 3 fluidtightly inserted, like a round-bar-like plug, into an aperture 2 of a specimen chamber 1 through an O-ring 4. The aperture 2 has a round cross-section and is disposed in a wall 1a of the specimen chamber 1.

A rotatable elongated member comprising a round-bar-like internal shaft 6 has one end thereof directly connected to the bottom of a cylindrical specimen stage 5. The shaft 6 is inserted fluidtightly into an aperture in shaft 3 through an O-ring 7. The aperture in shaft 3 is parallel to the axis about which it rotates and is disposed eccentrically thereof.

The specimen stage 5 has a flange 5a disposed at the end portion thereof which is connected to the shaft 6. Flange 5a engages with a stepped portion 2a of said aperture 2 in the specimen chamber wall. The stepped portion 2a is in a portion of the specimen chamber which is fixed to a magnetic pole 8 of an electron lens of the electron microscope. When the inside of said specimen chamber 1 is evacuated the flange 5a is forcibly pressed against the stepped portion 2a due to the force on the shaft 6 caused by the pressure differential between the chamber and the atmosphere.

A pilot member 9 having a pilot area 9a, approximately as large as the aperture of the specimen stage 5 for holding a specimen, is fixed by a set screw 10 to the external end of the internal shaft 6. Indicating means are provided comprising an indicating member 13 having an indicating part 13a located close to pilot area 9a and in correspondence with a portion 11a, of a specimen 11 mounted on said specimen stage 5, that is irradiated by electron beam 12.

The base of the indicating member 13 comprises a shaft 14 fitted in a supporting cylinder 15 which is fixed to the outer surface of the specimen chamber wall 1a. The supporting cylinder 15 also has disposed therein a spring 16 which contacts the base of said indicating member 13 through a die 15a, permitting the indicating member 13 to rotate and move up and down.

In FIG. 1 reference numeral 17 denotes a collector mesh, 18 a scintillater, 19 a photo-guide, and 20 a photo-multiplier.

The operation of the specimen mounting apparatus will now be described with respect to the structure described above. A desired portion of the specimen 11 is scanned with an electron beam 12, and secondary electrons generated thereby from the surface of the specimen are collected by said collector mesh 17 and fed to the scintillator 18, where they are converted into light which is then converted into electricity in the photomultiplier 20. A enlarged image of the desired portion of said specimen is projected on a Braun tube (not shown) through an amplifier (not shown in the drawings).

During the use of the electron microscope when the specimen stage 5 is in a position wherein a portion 11a of specimen 11 is irradiated, an adjustment of the position of the portion 11a may be desired. The adjustment of the portion 11a of specimen 11 which is irradiated by the electron beam 12 is effected by turning the external shaft 3 thereby turning shaft 6 and then turning the internal shaft 6 with respect to shaft 3, which is eccentrically positioned with respect thereto, by holding the upper end of said external shaft 3 and pilot member 9. The relative position of electron beam on the specimen is changed by this operation and is indicated on the pilot area 9a by the indicating part 13a of the indicating member 13.

During this adjustment of the portion of the specimen, the flange 5a of the specimen stage 5 is pressed against the stepped portion 2a which is coupled to the magnetic pole 8 of the electron lens to transmit vibratory motion from one to the other. This keeps the irradiated portion of the specimen and the electron beam free from relative movement and thus free from the influence of vibrations from the outside. As a result the image on said Braun tube does not collapse.

When a change of the specimen 11 is desired, the inside of the specimen chamber 1 is returned to atmospheric pressure and the indicating member 13 is raised so that the external shaft 3 may be removed together with the specimen stage 5 and the internal shaft 6. When the parts are removed, the specimen 11 in the specimen stage 5 can be changed.

The specimen stage 5 can be reinserted into the specimen chamber 1 by simply pushing it into aperture 2 in the specimen chamber wall together with the internal shaft 6 and the external shaft 3, when the inside of the specimen chamber 1 is evacuated, both the internal and external shafts are sucked inward to hermetically seal the aperture 2.

The specimen stage 5 is thus maintained at a predetermined position, with the flange 5a thereof forcibly abutting against the stepped portion 2a in the aperture, as described above. The position of the electron beam 12 on the specimen 11 is indicated by the indicating member 13 and adjustment of the position of the specimen by the rotation of the internal and external shafts 6 and 3 of the specimen stage are also performed as described above.

As detailed above, the specimen mounting apparatus for an electron microscope according to the present invention has a simple construction and is easy to insert and remove into the electron microscope. The apparatus also makes focusing on a specimen relatively free from vibration.

While preferred embodiments of the invention have been shown by way of example in the drawings, it will be understood that the invention is in no way limited to these embodiments.

What we claim is:

1. In an electron microscope having a specimen chamber evacuated during use of the microscope, an electron beam operative during use of the microscope to irradiate a portion of a specimen and an electron lens for focusing the beam, an apparatus for adjustability and releasably mounting a specimen to undergo irradiation during use of the microscope and for substantially reducing the effect of vibration on the focusing of the beam, said apparatus comprising: specimen-holding means positionable into an irradiating position wherein a portion of the specimen is exposed to the electron beam and including means for adjustably positioning the specimen when said specimen-holding means is in said irradiating position to variably select the portion of the specimen exposed to the electron beam, means for releasably mounting said specimen-holding means in said irradiating position, and means for rigidly releasably coupling said specimen-holding means to the electron lens when said specimen-holding means is in said irradiating position, said means for releasably mounting said specimen-holding means comprising, a cylindrical support member having a pair of opposed end surfaces and a lateral surface, means mounting said specimen-holding means at one of said end surfaces, means defining a circumferential shoulder on a portion of said lateral surface, and means defining an annular recess in said lateral surface circumferentially of said lateral surface, means defining a throughbore between the interior and the exterior of said specimen chamber for receiving said cylindrical support member, said means defining a throughbore including means defining a second shoulder in a wall of said specimen chamber for engaging with said circumferential shoulder on said lateral surface of said cylindrical support member when said cylindrical support member is disposed within said throughbore, and means disposed within said annular recess hermetically sealing said cylindrical support member in said throughbore, said cylindrical support member having one of said opposed end surfaces exposed to the interior and exterior of said specimen chamber respectively whereby said cylindrical support member is forced toward the interior of said specimen chamber whenever a pressure differential is developed between the interior and the exterior of said specimen chamber to engage said shoulders for rigidly releasably coupling said specimen-holding means by said cylindrical support member to the electron lens to transmit vibratory motion from said specimen-holding means to the lens to substantially prevent the relative movement of one with respect to the other whenever said specimen-holding means is induced to vibrate thereby maintaining the focus of the electron beam on the selected portion of the specimen.

2. In an electron microscope according to claim 1, wherein said specimen-holding means comprises a rotable, elongated cylindrical member having means disposed at one end portion thereof for mounting the specimen and wherein said cylindrical support member includes means defining a throughbore parallel to main axis of said cylindrical support member for receiving said elongated member therein for adjustable rotational movement about the longitudinal axis thereof.

3. In an electron microscope according to claim 2, wherein said throughbore has an axis parallel to said main axis and disposed eccentrically thereof, and wherein said means for adjustably positioning the specimen further comprises means mounting the support member for adjustable rotational movement about said main axis.

4. In an electron microscope according to claim 1, wherein said means for coupling comprises means for forcibly abutting a portion of said specimen-holding means on the electron lens.

5. In an electron microscope according to claim 1, wherein said means for coupling comprises a rigid intermediate member contacting the electron lens, and means for forcibly abutting a portion of said specimen-holding means on said intermediate member.

6. In an electron microscope according to claim 1, wherein said means for releasably mounting said specimen-holding means comprises means defining an evacuatable specimen chamber receptive of a negative pressure applied thereto and having means therein defining a throughbore for fluid tightly receiving said specimen-holding means, whereby said specimen-holding means is forced towards said chamber whenever a pressure differential is developed between said chamber and the atmosphere.

7. In an electron microscope according to claim 1, further comprising indicating means for indicating the relative position of the specimen thereby indicating the portion of the specimen exposed to the electron beam.

* * * * *